(12) United States Patent
Bellaouar et al.

(10) Patent No.: US 6,566,966 B1
(45) Date of Patent: May 20, 2003

(54) FAST LOCK/SELF-TUNING VCO BASED PLL

(75) Inventors: Abdellatif Bellaouar, Dallas, TX (US); Khaled Sharaf, Cairo (EG)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/663,985

(22) Filed: Sep. 18, 2000

(51) Int. Cl.[7] .............. H03L 7/06; H03L 7/08
(52) U.S. Cl. .............. 331/10; 331/14; 331/16; 331/17; 331/25
(58) Field of Search .............. 331/1 A, 10, 11, 331/14, 16, 17, 18, 25, DIG. 2; 327/156–159; 360/51; 375/376; 455/260

(56) References Cited

U.S. PATENT DOCUMENTS

| | | | |
|---|---|---|---|
| 3,882,403 A | * 5/1975 | Gerken | 328/14 |
| 3,982,190 A | * 9/1976 | Schaefer | 328/110 |
| 4,550,292 A | * 10/1985 | Smith | 331/2 |
| 4,859,968 A | * 8/1989 | Gershon | 331/38 |
| 5,124,671 A | * 6/1992 | Srivastava | 331/10 |
| 5,450,621 A | * 9/1995 | Kianush et al. | 455/192.2 |
| 5,821,818 A | * 10/1998 | Idei et al. | 331/17 |
| 6,035,182 A | * 3/2000 | Shurboff | 455/216 |

* cited by examiner

*Primary Examiner*—David C. Mis
(74) *Attorney, Agent, or Firm*—Ronald O. Neerings; Wade James Brady III; Frederick J. Telecky, Jr.

(57) ABSTRACT

A fast lock/self-tuning VCO based PLL integrated circuit (10) adapted for implementation in wireless communication systems requiring a high transfer data rate. The present invention is preferably implemented using and RFSiGe or a CMOS process in a WDCMA chipset, and can be used in other systems such as GSM and EDGE. The present invention utilizes the content of a divider (24) as a monitor of the lock condition of the PLL (10), permitting the fast-tuning of the VCO (14) to almost the final frequency using a controller (22) and a coarse DAC (20).

21 Claims, 3 Drawing Sheets

| CODE₁ | CODE₀ | D₂ D₁ D₀ |
|---|---|---|
| 0 | 0 | 0 0 0 |
| 0 | 1 | 0 0 1 |
| 1 | 0 | 0 1 1 |
| 1 | 1 | 1 1 1 |

FAST LOCK/SELF-TUNING VCO BASED PLL

FIELD OF THE INVENTION

The present invention is generally related to Phase Lock Loop (PLL) circuits, and more particularly to PLL semiconductor integrated circuits having integrated voltage controlled oscillators (VCOs) such as those used in wireless communication systems.

BACKGROUND OF THE INVENTION

Phase Lock Loop (PLL) integrated circuits (ICs) find practical advantages in many electronic circuits, and in particular, in wireless communications systems dealing with high-speed data transfer including receivers. In wireless systems, it is critical to achieve both fast lock and perfect tuning of a voltage controlled oscillator (VCO) comprising a portion of the PLL. In conventional PLL circuits having an integrated VCO, tuning of the VCO may take a relatively long period of time which may not be tolerable in circuit designs handling high data transfer rates. The longer an oscillator takes to tune directly impacts the lock time of the PLL. Moreover, prior art semiconductor PLL circuits require a relatively large overhead circuit and extra power dissipation which are undesirable characteristics when embodied in silicon designs, such as in wideband code division multiple access (WCDMA) chipsets.

There is desired an improved PLL having both a fast lock time and an accurate self-tuning VCO having both a reduced overhead circuit and generating less power dissipation than those presently available.

SUMMARY OF THE INVENTION

The present invention achieves technical advantages as a fast lock/self-tuning VCO based PLL whereby counters used in a divider are monitored to determine the lock condition of the PLL. A digital to analog converter (DAC) controls the course tuning of the VCO and is predistorted to lineraize the tuning of the VCO. Advantageously, the present invention merges the DAC with the VCO. The present invention allows an almost perfect tuning of the VCO and fast lock operation, which is critical in wireless systems handling high speed data transfer, such as WDCMA based communications. The present invention is preferably implemented in RFSiGe or CMOS process in a WDCMA chipset, and can be used in other systems such as GSM and EDGE. The present invention is also advantageous for use in new fractional-N PLL products.

DETAILED DESCRIPTION OF THE PREFERRED EMBODIMENT

Figure 1:
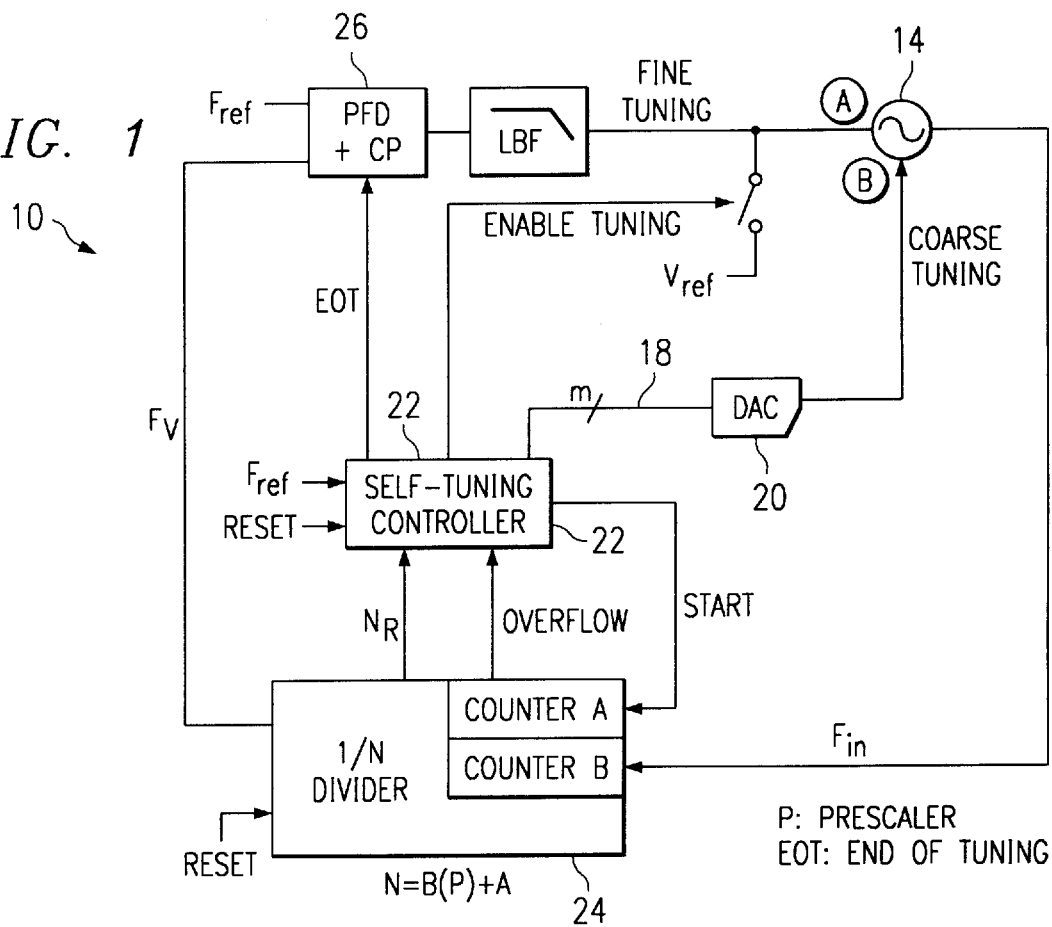
FIG. 1 depicts a PLL loop circuit according to the present invention whereby a controller monitors the state of counters forming a divider circuit.

An interpolation technique of the first preferred embodiment of the present invention can be applied to both integer and fractional frequency synthesizers and is seen in FIG. 1.

Initially, a PLL loop circuit 10 shown in FIG. 1 is opened and a fine-tuning input 12 to a VCO 14 is set to some fixed reference voltage (i.e. ½ supply voltage: VCC/2) and a coarse tuning input 16 is set to a minimum frequency i.e. a digital input 18 to a digital-to-analog converter (DAC) 20 is set to a digital code 00000 by a loop controller 22. The counters A and B in divider 24 are controlled by controller 22 to then start to countdown and set the division ratio, where:

$$N=B(P)+A.$$

According to the present invention, the tuning controller 22 monitors the state of each counter A and B and its residue for some predetermined time window:

$T_{st}=M \times F_{ref}$ where M is the number of cycles of monitoring.

Since $F_{in}$ is smaller than the target output frequency, where the DAC 20 digital input is set to 0, for every $F_{ref}$ cycle the counters A and B will not overflow.

For each $T_{st}$ time iteration the counters will have a residue number called $N_r$:

By neglecting the residue in counter A after M cycles, it can be proved that the error $\Delta f_0$ in frequency is:

$$\Delta f_0(N_R) \times F_{ref} \text{ thus,}$$

$$\Delta f_0 = \Delta B \times P \times F_{ref}$$

Examples of this interpolation technique illustrate the advantages of the present invention.

EXAMPLE 1

DAC input: 00000  $F_{out}(VCO)$: 855 MHz
Assuming a linear relation:  :  :
DAC input: 11111  $F_{out}(VCO)$: 1010 MHz With a 5-bit DAC:

$K_{DAC}$=5 MHz/LSB where $K_{DAC}$ is the VCO/DAC gain
Assuming a linear relation:
Referenced clock: 10 MHz
P=8 (prescalar number)
If want target frequency=880 MHz $F_{ref}$ = 10 MHz $F_0$ = 880 MHz -continued $$N = \frac{880 \text{ MHz}}{10 \text{ MHz}} = 88 = (11 \times 8) + 0 = \left.\right)\left(\begin{array}{c}B=11\\A=0\end{array}\right)$$

Initially, the digital input at the DAC 20 input is set at 0, and therefore, $f_0$=855 MHz. Now, to determine the correction of the input to the DAC 20 to get near the target frequency of 880 MHz, the Frequency error to be corrected is determined:

$\Delta f_0$=880 MHz–855 MHz=25 MHz since $\Delta f_0 = \Delta B \times P \times F_{ref}$ $$\Delta B = \frac{\Delta fo}{P \times F_{ref}} = \frac{25 \text{ MHz}}{8 \times 10 \text{ MHz}} = 0.3125$$

which is difficult to detect.

If M=16 clock cycles, the monitoring time of the counter residue is 16 cycles of the reference clock.

Then: $\Delta B_m = M \times \Delta B = 16 \times 0.3125 = 5$

The residue number in the B counter is 5, and that is exactly what is needed to correct the DAC input to get the correct desired frequency:

In summary, the DAC input=0+5=5 [00101] to get $F_{out}$=855+5×(5 MHz/$_{LSB}$)=880 MHz

EXAMPLE 2

Desired target frequency: 960 MHz

Where: B=12 P=8 A=0 $F_{ref}$=10 MHz
thus, frequency error $\Delta f_0$=105 MHz $$\Delta B = \frac{105 \text{ MHz}}{10 \text{ MHz} \times 8} = 1.3125$$

therefore: $\Delta B_m = 16 \times 1.3125 = 21$

Thus, the DAC digital input is corrected (increased) by 21 [10101] Hence:

$f_0$=21×5 MHz/LSB+855=960 MHz

An example of not neglecting the residue in A in the equation N=P(B)+A, is illustrated in the next example:

EXAMPLE 3

$\Delta f_0 = \Delta N \times F_{ref}$ for: $F_0$=920 MHz $F_{ref}$=10 MHz $N = (11 \times 8) + 4$ where $B = 11$
$A = 4$ $$\Delta N = \frac{\Delta fo}{F_{ref}} = \frac{920-855}{10} = 6.5$$

For 16 clock cycles ($M = 16$) $\Delta N_M = 16 \times 6.5 = 104$ $$\Delta B = \frac{\Delta N_M}{P} = \frac{104}{8} = 13$$

Thus, the digital input to DAC 20 has to be incremented by 13 LSBs:

$F_{out}$=855+(13×5)=920 MHz

After the coarse tuning through the DAC 20, a phase detector 26 which includes a charge pump, is enabled by controller 22, the precharge circuit to Vref is disabled, and the PLL finishes the lock through fine tuning. Most of the lock time will be phase locking, after finishing the tuning.

Figure 2:
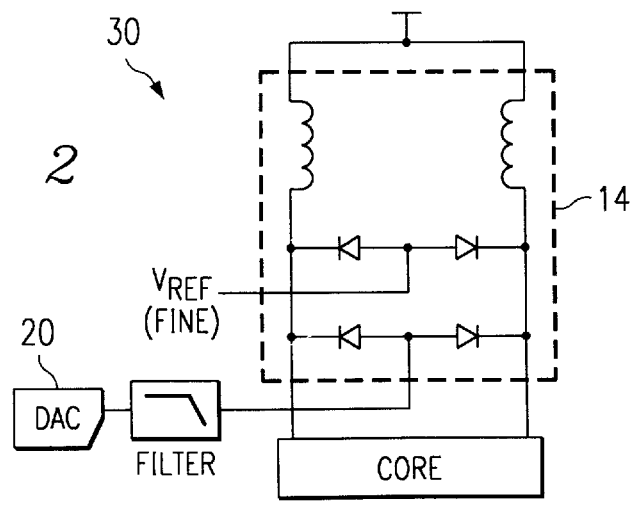
FIG. 2 depicts a schematic of one implementation to merge a DAC with a VCO.

One circuit implementation achieving the VCO tuning is shown in FIG. 2 at 30, with the varactors depicted as diodes, but alternatively could also comprise MOS—type varactors. The oscillator frequency of the VCO function of the reverse voltage is not linear, and is shown in FIG. 3.

Figure 3:
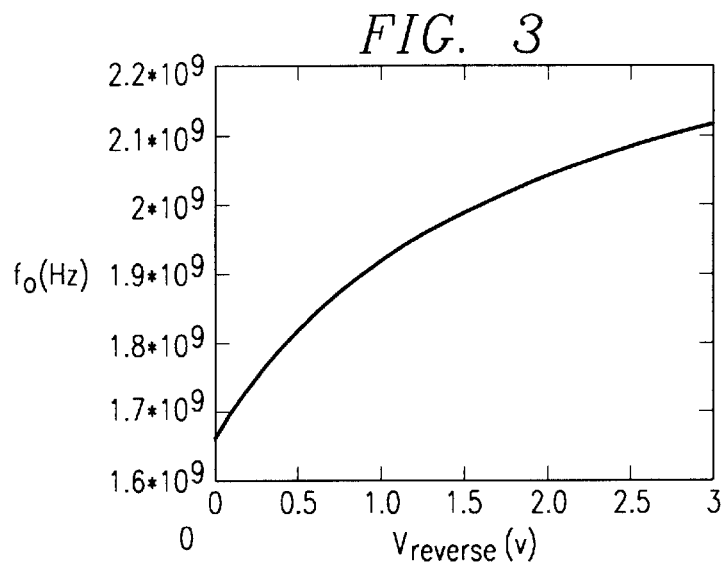
FIG. 3 depicts a graph of the oscillator frequency of the VCO as a function of the reverse voltage, depicting the non-linear relationship.
Figure 4:
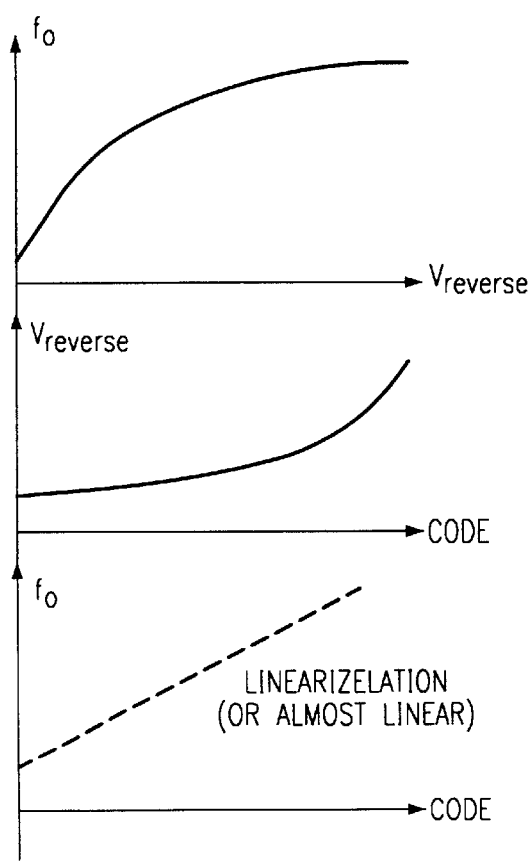
FIG. 4 illustrates graphs depicting how to make the oscillator frequency of the VCO function linear by predistorting the DAC to be a non-linear voltage generator having an operating curve being opposite to the effect of the varactor shown in FIG. 3.

Advantageously, according to the present invention, one way to make the oscillator frequency of the VCO function linear and get more accurate tuning is to make the DAC 20 a non-linear voltage generator with an opposite curve to that shown in FIG. 3, with the effect of the varactor operating as shown in FIG. 4.

Figure 5:
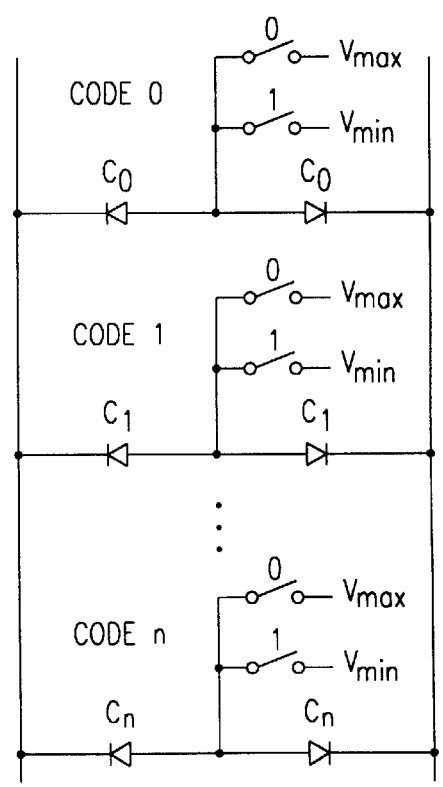
FIG. 5 depicts a schematic illustrating another way to make to achieve linear control of the frequency by merging the DAC with the varactor.

According to an alternative embodiment of the present invention, another way to make this linear control of the frequency through the DAC 20 is to merge the DAC with the varactor, as shown at 40 in FIG. 5

Capacitor $C_0$ is a function of (Vmin, Vmax), where $$\left[\begin{array}{c} Vmin \rightarrow C_0 min \\ Vmax \rightarrow C_0 max \end{array}\right]$$

For code=[code$_n$ . . . code$_0$]=[00 . . . 0] where the capacitance is maximum and $f_0$ is minimum, by incrementing the code by 1 from minimum, $C_0$ is decreased, then capacitor $C_1$ is decreased, . . . and finally capacitor $C_n$ is decreased. If capacitors $C_0$, $C_1$ and . . . $C_n$ are sized accordingly, then the relation:

$f_0$=function (code) can be made almost linear, where sizing depends on the relation C (V).

However, since the array is binary weighted, then the linearity is difficult to meet.

Figure 6:
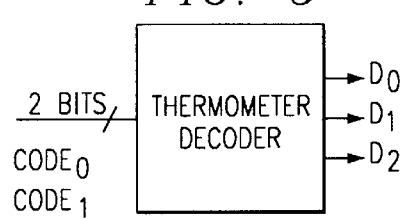
FIG. 6 is a schematic of a weighted array using thermometer decoding for each code increment by mixing only one varactor such that the sizing of the varactor is made to have a linear relation.

So, another improvement according to the present invention is based on an un-weighted array using thermometer decoding, as shown at 50 in FIG. 6. For each code increment, incrementing is achieved by mixing only one varactor. Advantageously, the sizing of the varactor can be made so to have a linear relation between $f_0$ and code.

This technique can even be applied to other types of VCOs. The present invention derives technical advantages by using the content of the counters to easily know if the VCO 14 is tuned.

For more accurate tuning, multiple adjustments of the tuning DAC 20 can be used instead of one adjustment, to overcome the problems associated with process variations and any non-linearity effects.

An example to illustrate this, similar to Example 3, is shown below.

EXAMPLE 4

Target frequency $F_0$=920 MHz $F_{ref}$=10 MHz

N=11 (P)+4 (P:8 prescalar modulus 8/9)

Assume that the DAC gain is slightly different than 5 MHz/LSB, and in this example 5.5 MHz/LSB (process effect). [The 5.5 MHz/LSB is a prior not known]

From Example 1, $\Delta B$=13

Using a two-step adjustment for the DAC, so:

The DAC 20 has to be incremented by 6 LSBS $$\left(\leq \frac{1}{2}\Delta B\right)$$

Then, using another times cycle of 13 reference cycles to measure the new ΔB:

$$\Delta B_t = 6\Delta A = 3$$

Reference cycle:

$$\Delta N = \frac{920 - 888}{10} = 3.2$$

$$\Delta N_m = 51.2 \cong 51$$

Note, normally Δf=6 LSB=5.5=33 MHz:

In the second step, the DAC digital input is moved again by 6 LSBs. The final frequency is 921 MHz, which is around 0.1% of the target frequency. By increasing the dynamic range of the tuning DAC 20 and using more reference cycles for time, and also using ΔA information for DAC adjustment, more accuracy can be achieved.

However, the number of increments of DAC 20, the number of reference cycles of calibration, and the number of adjustment steps (phases) depends on the allowed time of the calibration. An optimum design can be found in this case. For the previous example, 2 adjustment steps, 5-bit DAC, and 16 reference cycles for adjustment, needs at least 3.2 μs without accounting overhead times due to some timing set-up.

Advantageously, the overflow of the counters can be used to detect a large ΔB during tuning because ΔB max is limited by the programmed ΔB for a targeted change.

Advantages of this approach:
1. The VCO is tuned automatically when the PLL is powered on (or on any reset) and during the lock time.
2. The control line is precharged to almost the final setting (including charging the filter) and hence, achieving a fast lock time when switched from tuning to locking.
3. The tuning algorithm is very simple, and does not need a large overhead circuit and time.
4. The DAC is merged with the VCO, saving circuit silicon space and easing the tuning.
5. Pre-distortion of the DAC eases the tuning to almost a perfect situation.
6. The technique can be applied to any PLL type circuit, etc.

Figure 7:
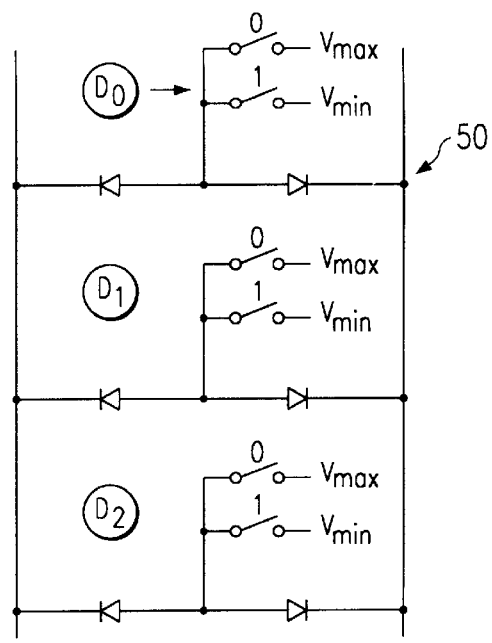
FIG. 7 depicts a binary search technique making the residue in the counters equal to zero, whereby the DAC is programmed by the binary search technique until the counter residue is zero or negligible.
Figure 7:
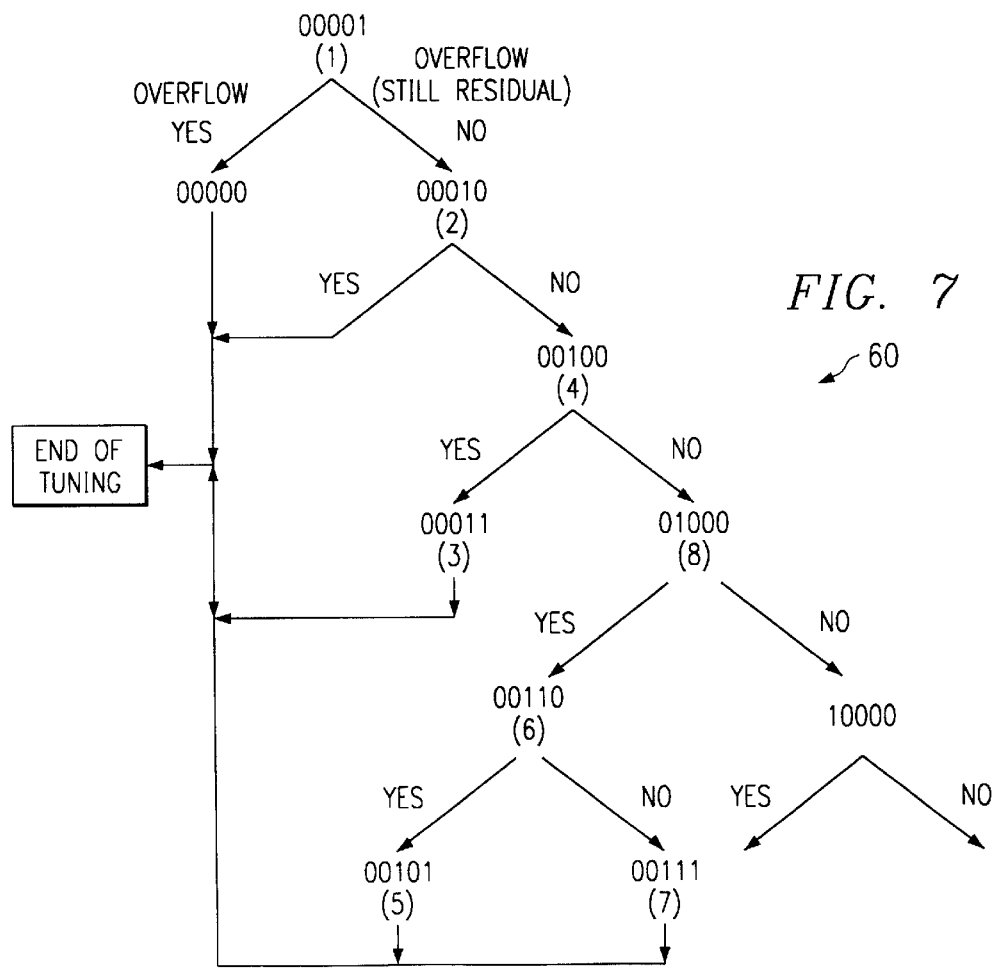

Another preferred method of performing self-turning will now be discussed. This alternate approach is based on a binary search technique to make the residue in the counter= 0. So, the DAC is programmed by binary search technique until the counter residue is 0 or negligible, as shown at 60 in FIG. 7.

This approach 60 of self-tuning is similar to a successive approximation technique used in analog-to-digital converters (ADCs). This binary search technique can also be combined with the interpolation technique described with reference to FIGS. 1—4 as an automatic tuning technique. This binary search technique 60 works very well, however, it requires at least N times the reference time to finish tuning, where N is the number of bits of the VCO DAC. To reduce the tuning time, initially, M bits out of N bits (M<N) are tuned using the binary search technique, then with the interpolation technique 10 being used to determine the rest of the bits (N−M). The partition of bits depends on the allowed PLL lock time, and the accuracy of the interpolation technique. Of course, other binary search techniques can be used.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

What is claimed is:

1. A phase-locked loop (PLL) circuit, comprising;
    a voltage controlled oscillator (VCO) having a first input and a second input; and
    a VCO control circuit coupled to said first input and said second input, said VCO control circuit providing a first signal to said first input for controlling a coarse tuning of said VCO and providing a second signal to said second input for controlling a fine tuning of said VCO, wherein said VCO control circuit utilizes the contents of a counter in said VCO control circuit in controlling said VCO tuning and monitors a state of said voltage controlled oscillator (VCO).

2. The phase-locked loop (PLL) circuit as specified in claim 1 wherein a digital-to-analog converter (DAC) in said VCO control circuit is utilized in controlling said VCO coarse tuning, output of said DAC being predistored to responsively linearize the tuning of said VCO.

3. The phase-locked loop (PLL) circuit as specified in claim 1 wherein said VCO control circuit self-tunes said VCO.

4. The phase-locked loop (PLL) circuit as specified in claim 1 wherein said VCO control circuit utilizes the contents of said counter in coarse tuning said VCO to a near-final frequency.

5. The phase-locked loop (PLL) circuit as specified in claim 1 wherein said VCO control circuit further comprises a second counter, wherein said first counter and said second counter form a divider and set a division ratio.

6. The phase-locked loop (PLL) circuit as specified in claim 5 wherein said VCO control circuit monitors a content of both said counter and said second counter and responsively controls said coarse tuning of said VCO.

7. The phase-locked loop (PLL) circuit as specified in claim 6 wherein said VCO control circuit monitors a residue of said counter.

8. The phase-locked loop (PLL) circuit as specified in claim 2 wherein said DAC utilizes an interpolation technique.

9. The phase-locked loop (PLL) circuit as specified in claim 2 wherein said DAC utilizes a binary search technique.

10. The phase-locked loop (PLL) circuit as specified in claim 2 wherein said DAC utilizes a combination of an interpolation technique and a binary search technique.

11. A method of tuning a voltage controlled oscillator (VCO) in a phase-locked loop (PLL) circuit, comprising the steps of:
    providing a first signal to a one input of said VCO for controlling a coarse tuning of said VCO and providing a second signal to a second input of said VCO for controlling a fine tuning of said VCO;
    providing circuitry to monitor a state of said VCO; and
    utilizing the contents of a counter in said VCO control circuit in controlling said VCO tuning.

12. The method as specified in claim 11 further comprising the step of predistorting the output of a digital-to-analog converter (DAC) provided to said VCO to responsively linearize the tuning of said VCO.

13. The method as specified in claim 11 wherein said VCO control circuit further comprises a second counter, said first counter and said second counter forming a divider and determining a division ratio.

14. The method as specified in claim 13 further comprising the step of said VCO control circuit monitoring a content of both said first counter and said second counter and responsively controlling said coarse tuning of said VCO.

15. The method as specified in claim 14 further comprising the step of said VCO control circuit monitoring a residue of said first counter.

16. The method as specified in claim 12 further comprising the step of said DAC utilizing an interpolation technique.

17. The method as specified in claim 12 further comprising the step of said DAC utilizing a binary search technique.

18. The method as specified in claim 12 further comprising the step of said DAC utilizing a combination of an interpolation technique and a binary search technique.

19. A phase-locked loop (PLL) circuit, comprising:

a voltage controlled oscillator (VCO);

a phase detector coupled to a first input of said VCO;

a digital-to-analog converter (DAC) coupled to a second input of said VCO;

a tuning controller coupling a divider to said phase detector and said DAC, in which said tuning controller monitors a state of said voltage controlled oscillator (VCO).

20. The phase-locked loop (PLL) circuit as specified in claim 19, further including a direct connection between said divider and said VCO and a direct connection between said divider and said phase detector.

21. The phase-locked loop (PLL) circuit as specified in claim 19, further including a first counter and a second counter in said divider.

* * * * *